(12) United States Patent
Supino et al.

(10) Patent No.: US 8,735,199 B2
(45) Date of Patent: May 27, 2014

(54) METHODS FOR FABRICATING MEMS STRUCTURES BY ETCHING SACRIFICIAL FEATURES EMBEDDED IN GLASS

(71) Applicant: Honeywell International Inc., Morristown, NJ (US)

(72) Inventors: Ryan Supino, Loretto, MN (US); Grant H. Lodden, Minnetrista, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/749,008

(22) Filed: Jan. 24, 2013

(65) Prior Publication Data

US 2014/0057382 A1    Feb. 27, 2014

Related U.S. Application Data

(60) Provisional application No. 61/691,984, filed on Aug. 22, 2012.

(51) Int. Cl.
*H01L 21/00* (2006.01)

(52) U.S. Cl.
USPC ............................................. 438/50; 438/53

(58) Field of Classification Search
USPC ..................... 438/50, 52, 53; 257/415, 419
See application file for complete search history.

(56) References Cited

U.S. PATENT DOCUMENTS 7,444,873 B2 * 11/2008 Robert ....................... 73/514.32
2012/0272731 A1    11/2012 Supino et al.

OTHER PUBLICATIONS

Haque et al., "Hermetic Packaging of Resonators with Vertical Feadthroughs Using a Glass-in-Silicon Reflow Process", "Transducers '11", Jun. 2011, pp. 2303-2306.
Kawai et al., "Fabrication of Vertical & High-Aspect-Ratio Glass Microfluidic Device by Borosilicate Glass Molding to Silicon Structure", "14th International Conference on Miniaturized Systems for Chemistry and Life Sciences", Oct. 2010, pp. 1193-1195.

* cited by examiner

*Primary Examiner* — Reema Patel
(74) *Attorney, Agent, or Firm* — Fogg & Powers LLC (57) ABSTRACT

In an embodiment a method of fabricating a MEMS structure is provided. The method includes fabricating a working structure in a doped layer proximate a first surface of a silicon substrate. The first surface of the silicon substrate is bonded to a first planar glass structure having a first one or more sacrificial features embedded therein. The method also includes etching to remove a bulk of the silicon substrate, wherein the bulk is reverse of the first surface on the silicon substrate, wherein etching removes the bulk and leaves the working structure bonded to the first planar glass structure. The method also includes etching to remove the first one or more sacrificial features from the first planar glass structure.

20 Claims, 9 Drawing Sheets

METHODS FOR FABRICATING MEMS STRUCTURES BY ETCHING SACRIFICIAL FEATURES EMBEDDED IN GLASS

CROSS-REFERENCE TO RELATED APPLICATIONS

This application claims the benefit of U.S. Provisional Patent Application Ser. No. 61/691,984, filed on Aug. 22, 2012, which is hereby incorporated herein by reference.

STATEMENT REGARDING FEDERALLY SPONSORED RESEARCH OR DEVELOPMENT

This invention was made with Government support under FA8650-12-C-7203 awarded by AFRL. The Government has certain rights in the invention.

BACKGROUND

For various microelectromechanical system (MEMS) applications there is a need to lithographically pattern and etch high aspect ratio features into glass substrates. These applications include inertial sensors, quartz/glass MEMS resonators, MEMS rotary platforms, and others. Traditional methods of patterning these materials include wet chemical etch processes and deep reactive ion etching.

SUMMARY

In an embodiment a method of fabricating a MEMS structure is provided. The method includes fabricating a working structure in a doped layer proximate a first surface of a silicon substrate. The first surface of the silicon substrate is bonded to a first planar glass structure having a first one or more sacrificial features embedded therein. The method also includes etching to remove a bulk of the silicon substrate, wherein the bulk is reverse of the first surface on the silicon substrate, wherein etching removes the bulk and leaves the working structure bonded to the first planar glass structure. The method also includes etching to remove the first one or more sacrificial features from the first planar glass structure.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

Wet etching of glass materials is an isotropic process and makes high aspect ratio patterning and precise feature control difficult. Deep reactive ion etching (DRIE) provides better feature control than wet etching as well as the ability to form higher aspect ratio structures. However, DRIE processes for glass materials are comparatively slow, dirty, and require a thick metal hard mask that can cause stress issues and thermal mismatch problems. The thick hard mask is used because DRIE of glass is a mostly physical process with only a small chemical component. There are non-metal mask approaches including using silicon or thick photoresist/polymers, however, these approaches suffer from their own drawbacks. As such, feature control, aspect ratio, and surface quality are much more difficult to control than with DRIE processes on silicon.

Embodiments described herein provide for a method of fabricating a MEMS structure having high aspect ratio features in glass by etching out silicon that is embedded in the glass. FIGS. 1-11B illustrate example stages in such a method, where FIGS. 1-4B illustrate the process of forming silicon features in a glass substrate and FIGS. 5-11B illustrate an example MEMS device that can be fabricated by etching out the silicon features in the glass substrate.

Although the process below is described with respect to a single MEMS structure the process can be performed at the wafer level where a plurality of MEMS structures are formed in parallel. That is, a plurality of distinct MEMS structures can be formed in distinct regions on a wafer stack. The wafer stack can then be singulated to separate the distinct regions resulting in the plurality of MEMS structures.

Figure 1:
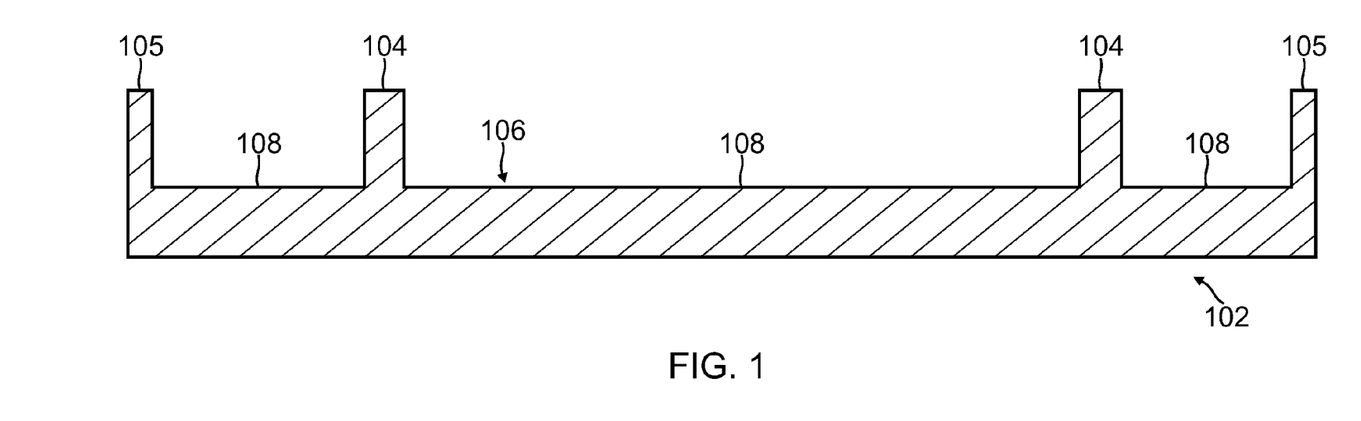
FIG. 1 is a cross-sectional view of a silicon substrate having features etched on a top working surface thereof according to embodiments described herein.

FIGS. 1-4A illustrate example cross-sections of the process flow for forming a glass substrate having one or more embedded silicon features. As shown in FIG. 1, a silicon substrate 102 is etched to define one or more features 104, 105 on a top working surface 106 thereof and one or more cavities 108 between the features 104, 105. The features 104, 105 can be formed using any suitable semiconductor fabrication processes. The silicon substrate 102 (including the features 104, 105) has a relatively low doping concentration. The features 104, 105 include one or more to-be embedded features 104 that are configured to be embedded in a glass substrate and subsequently etched out of the glass substrate to form a negative of the feature 104 in the glass substrate. Although this example illustrates each of the one or more features 104 extending a similar height, in other examples, different features in the silicon substrate 102 can have different heights.

Figure 2:
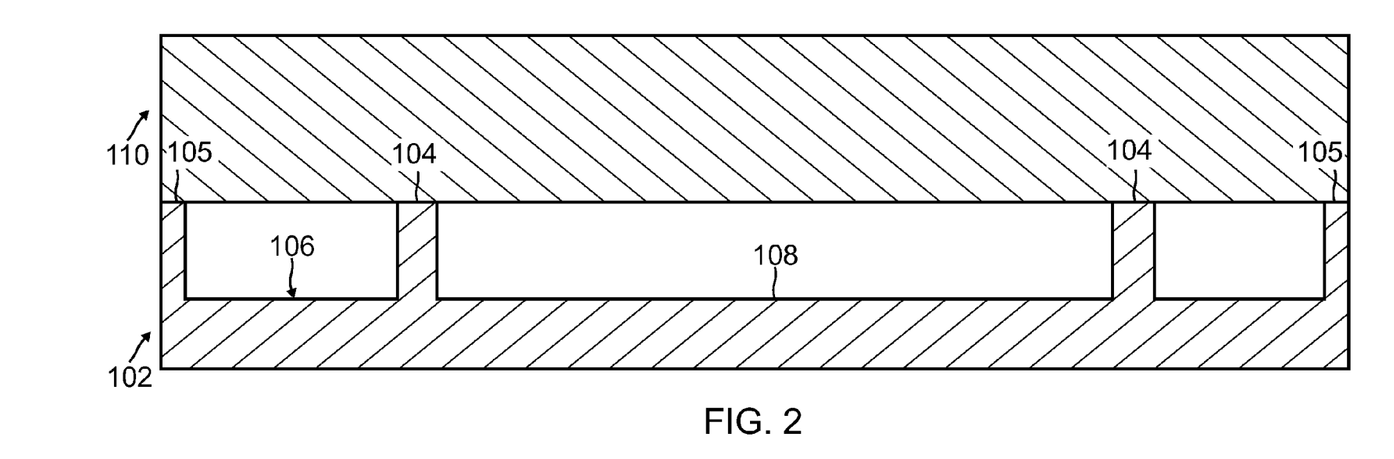
FIG. 2 is a cross-sectional view of a glass wafer bonded to the silicon substrate of FIG. 1 according to embodiments described herein.

The features 104, 105 also include an edge feature 105 that forms a continuous perimeter around the edge of the substrate 102. The edge feature 105 is used as an exterior wall such that a vacuum (see FIG. 2) can be formed in the cavity 108 between the edge feature 105 and the to-be embedded feature 104 and/or in an interior cavity formed by the edge feature 105 on all edges. Although FIG. 2 illustrates only a single device area (including the features 104) within the perimeter formed by the edge feature 105, in examples where the MEMS structure is formed at the wafer level, the edge feature 105 can be disposed around a perimeter of the entire wafer such that there are numerous device areas disposed within the perimeter, wherein each device area can include features 104. That is, a single edge feature 105 can form the exterior wall of a vacuum chamber for the entire wafer.

As shown in FIG. 2, a glass substrate 110 is bonded (e.g., an anodic bond) to the top working surface 106 of the silicon substrate 102. In an example, the glass substrate 110 is composed of borosilicate glass. The glass substrate 110 is bonded to the top working surface 106 in a vacuum such that the one or more cavities 108 between the features 104, 105 are sealed forming sealed vacuums in each cavity 108. The glass substrate 110 forms a "top" surface of the sealed vacuums, the bulk of the silicon substrate 102 forms a "bottom" of the sealed vacuums, and the features 105 as well as features 104 form side "walls" of the sealed vacuums. In some examples, the to-be-embedded features 104 may have a geometry such that the features 104 do not form walls of the sealed vacuums, relying instead solely on the edge features 105 to form such walls.

Figure 3:
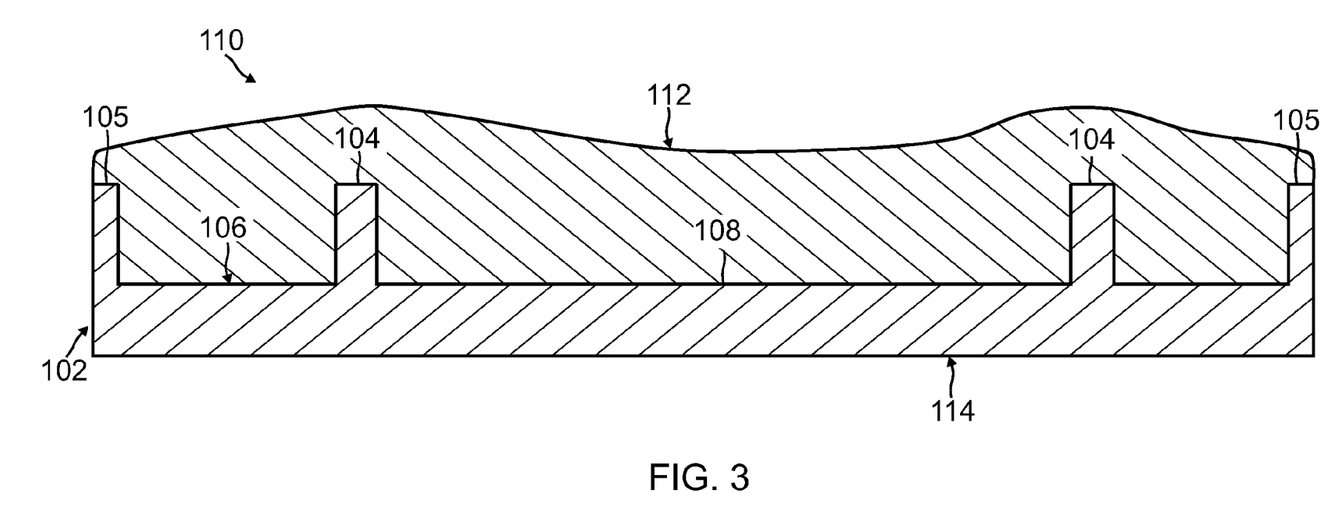
FIG. 3 is a cross-sectional view of the glass wafer and the silicon substrate of FIG. 2 after melting of the glass wafer according to embodiments described herein.

As shown in FIG. 3, the structure having the glass substrate 110 bonded to the silicon substrate 102 is heated beyond the softening point of the glass substrate 110 to vacuum form the glass substrate 110 around the features 104, 105 of the silicon substrate 102. That is, the glass substrate 110 flows to fill the cavities 108 between the features 104, 105 in the silicon substrate 102. The resulting glass and silicon structure has one of its major outer surface (faces) 112 formed by the glass substrate 110 and the other major outer surface (face) 114 (opposite outer surface 112) formed by the silicon substrate 102.

Portions of the outer surface 112 of the glass substrate 110 and the outer surface 114 of the silicon substrate 102 are then removed. In the example shown in FIG. 4A, the bulk of the glass substrate 110 and silicon substrate 102 is removed such that a generally planar glass structure 116 remains including silicon features 104 embedded therein and edge features 105 forming the edge of the planar structure 116. In this example, an amount of the glass substrate 110 is removed from the outer surface 112, such that the features 104, 105 are exposed. In other examples, removal of the glass substrate 110 on the outer surface 112 can leave some or all of the features 104 underneath a layer of the glass substrate 110 (i.e., not exposed); such an example can be used with features 104 having varying heights.

Figure 4A:
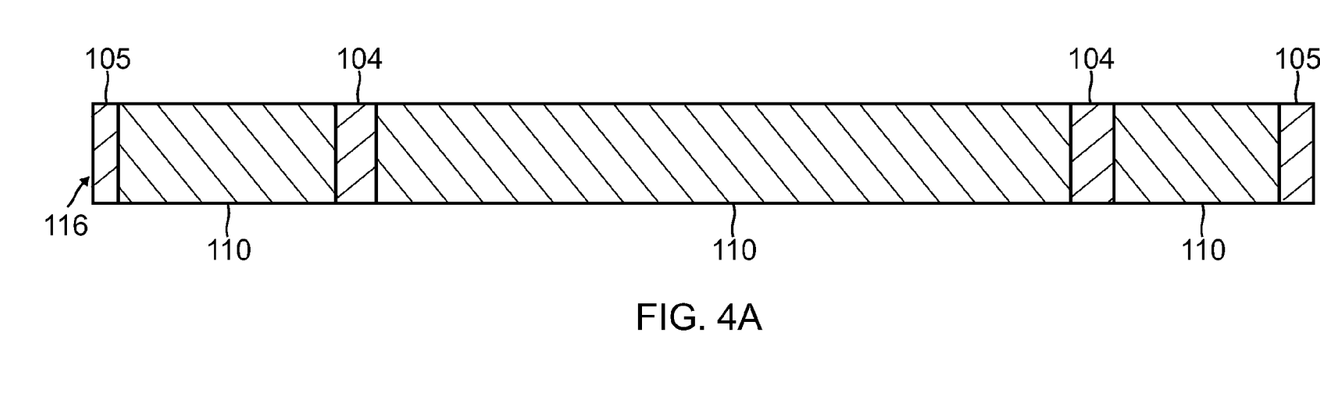
FIG. 4A is a cross-sectional view of a planar glass structure formed after machining the glass and silicon of FIG. 3 according to embodiments described herein.
Figure 4B:
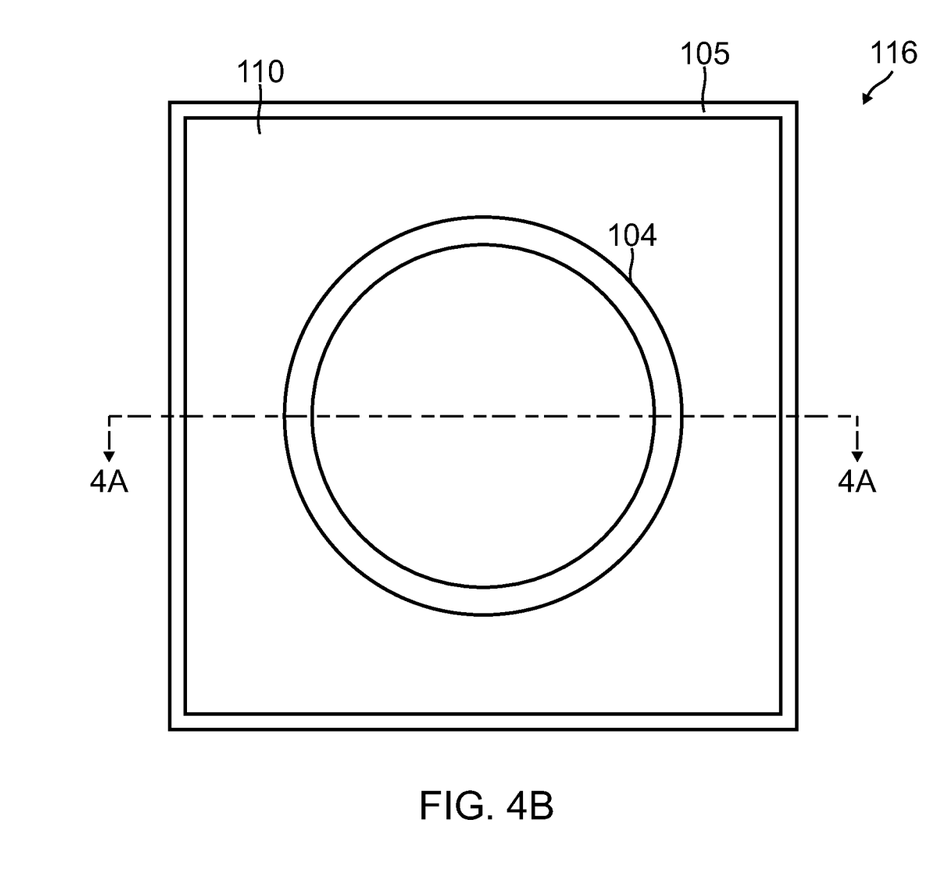
FIG. 4B is a top view of the planar glass structure of FIG. 4A according to embodiments described herein.

Removal of portions of the glass substrate 110 and the silicon substrate 102 can occur by cutting, polishing, etching, grinding, or any other appropriate method. In some examples, the resulting glass structure 116 is polished to form smooth surfaces. FIG. 4B is a top view of the planar glass structure 116 having silicon features 104 embedded therein and the edge feature 105 forming a perimeter on the edge thereof. As shown in FIG. 4B, the feature 104 has a circular geometry in the glass substrate 110. In other examples, more than one embedded feature and/or embedded features having other geometries can be used.

Figure 5:
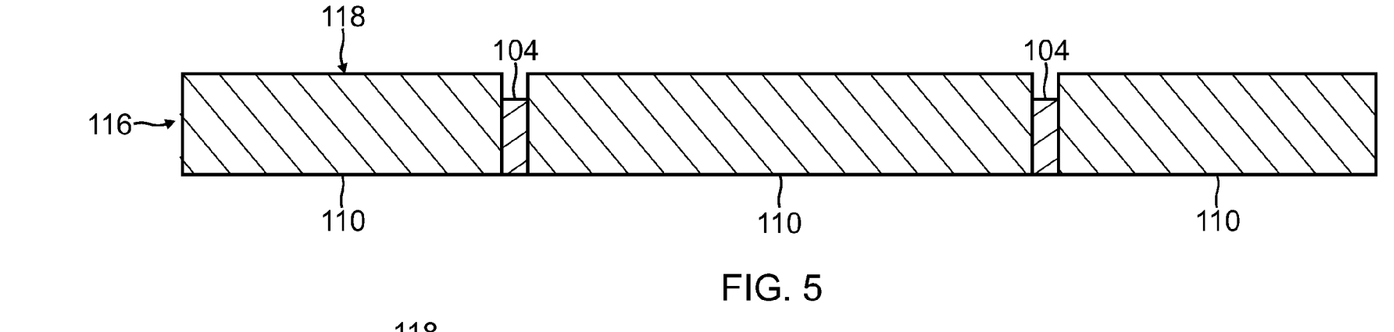
FIG. 5 is a cross-sectional view of the planar glass structure of FIG. 4A after etching of the silicon features according to embodiments described herein.

FIGS. 5-11B illustrate example stages in the formation of a MEMS structure fabricated by etching out the embedded silicon features 104 in the glass substrate 110. As shown in FIG. 5, the embedded feature 104 can be partially etched away at the first surface (side) 118 of the structure 116. This etch can be done with a DRIE or wet etchant. The edge feature 105 can also be removed by etching or machining In other examples, the edge feature 105 can be removed during other steps of the process.

Figure 6:
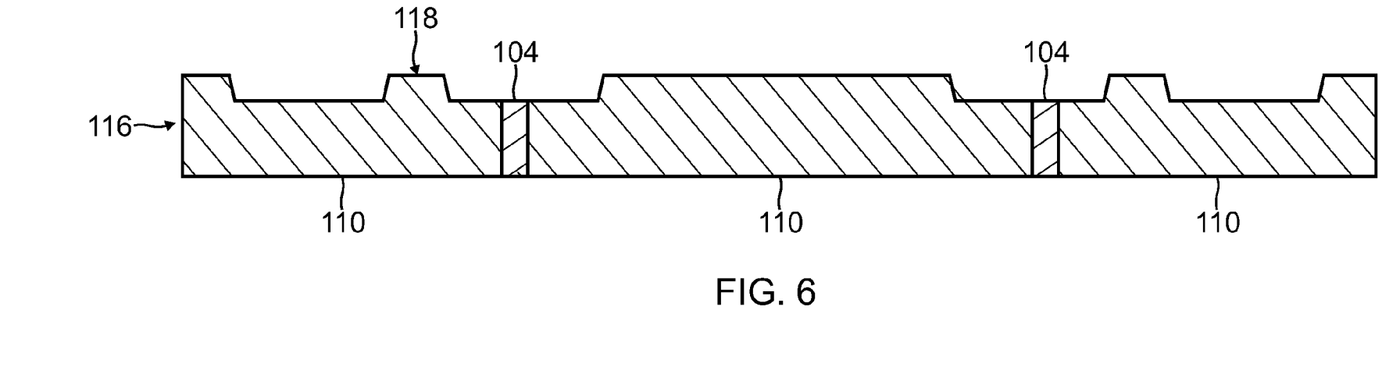
FIG. 6 is a cross-sectional view of the planar glass structure of FIG. 5 after etching of the glass surface according to embodiments described herein.

As shown in FIG. 6, portions of the glass substrate 110 at the first surface 118 of the structure 116 can also be etched away to form desired glass features (e.g., recesses/mesas) in the first surface 118. In some examples, a protection layer (e.g., a photoresist or polyimide) can be placed over the embedded features 104 on the first surface 118 to limit removal of portions of the embedded features 104 during etching of the first surface 118. In some examples, metallization can be patterned and placed on the first surface 118.

In an alternative example, instead of the embedded features 104 extending all the way through the glass structure 116, a layer of glass can be left on the outer surface 118 covering the embedded features 104 when the bulk of the glass substrate 110 is removed as discussed above (FIG. 4A), such that the embedded features 104 are not exposed on the outer surface 118 of the resulting planar glass structure 116. In an implementation of such an example, the embedded features 104 are not etched down as described with respect to FIG. 6, because the embedded features 104 are already below the surface 118 of the glass structure 116. In such an implementation, the glass surface 118 can be etched down to form the desired glass features (e.g., recesses/mesas) and expose the feature 104 in such recesses formed without partially etching the embedded features 104.

The above acts in FIGS. 1-6 can be repeated with a second glass substrate and second silicon substrate to form a second glass structure (116) having silicon features embedded therein. The (first) glass structure 116 and second glass structure (116) can be used to house a silicon working structure to form the resulting MEMS structure as described below.

Figure 7:
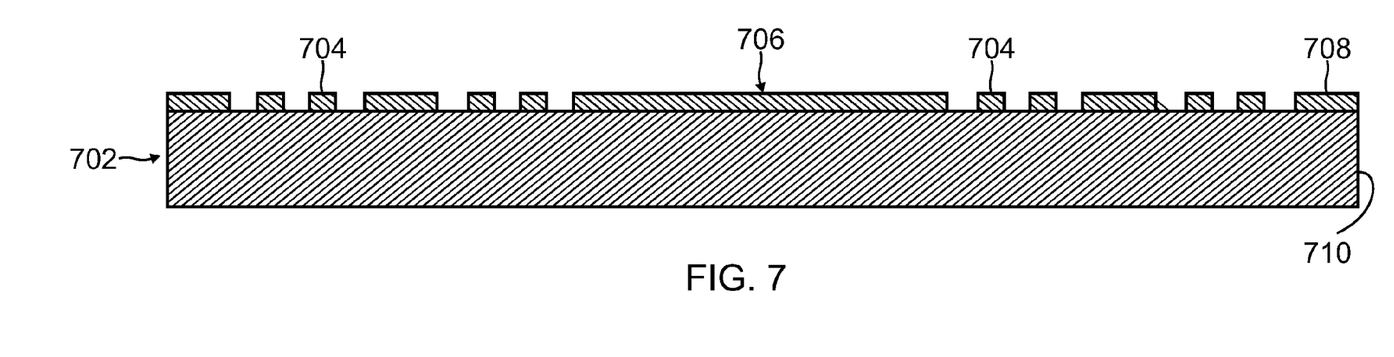
FIG. 7 is a cross-sectional view of a silicon substrate having features for a working structure formed in a top surface thereof according to embodiments described herein.

FIG. 7 illustrates a third silicon substrate 702 used to form the working structure for the MEMS structure. Features 704 are fabricated in top layer 708 forming a top working surface 706 of the third silicon substrate 702. The features 704 will become the working structure once the handle 710 (the bulk of the second silicon substrate 702) is removed as described below. Accordingly, the features 704 are fabricated according to the geometry of the working structure. In an example, the top layer 708 comprises a layer of the second silicon substrate 702 that is highly doped relative to the bulk 710 of the second silicon substrate 702 which has a low or no doping. The top layer 708 can be a degenerately doped p-type (p++) such that it acts as an etch stop in an etchant like ethylenediamine pyrocatechol (EDP). In an example, top layer 708 has a depth corresponding to the thickness of the resulting working structure. In example, the top layer 708 can be formed of highly doped epitaxial silicon on a silicon substrate 710. In another example, the top layer 708 can be formed by bonding a highly doped silicon wafer to a low or not doped silicon wafer and then polishing the highly doped wafer to reduce the thickness to a desired thickness (e.g., 25-100 microns). As shown in FIG. 7, the highly doped top layer 708 is proximate the top working surface 706 and has the features 704 fabricated therein, whereas the remainder of the substrate makes up the bulk 710 of the substrate.

Figure 8:
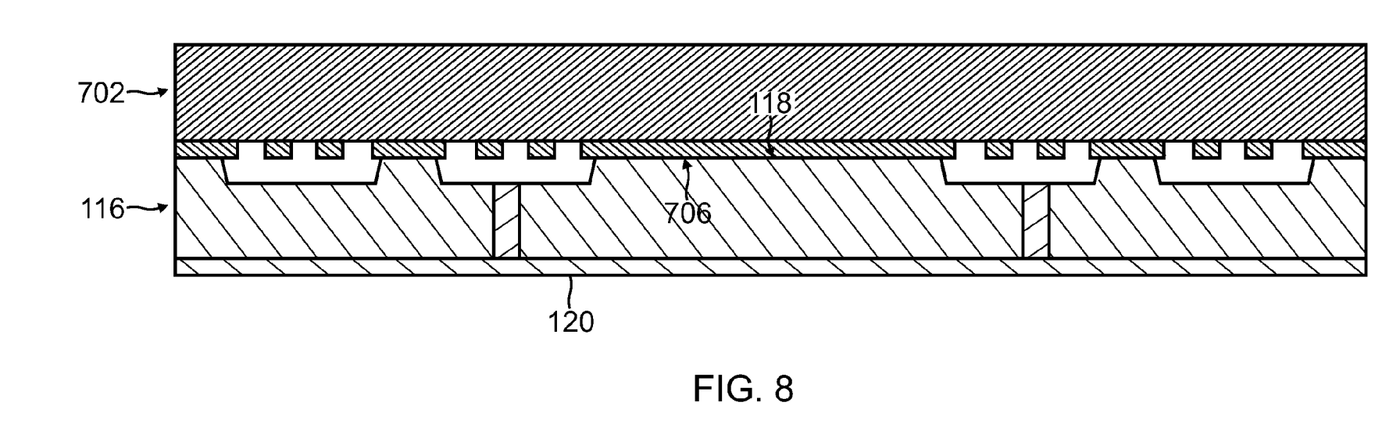
FIG. 8 is a cross-sectional view of the silicon substrate of FIG. 7 bonded to the planar glass structure of FIG. 6 according to embodiments described herein.

As shown in FIG. 8, the third silicon substrate 702 having the working structure fabricated therein is bonded (e.g., an anodic bond) to the first glass structure 116. The third silicon substrate 702 is bonded such that the top working surface 706 (i.e., the top layer 708) of the third silicon substrate 702 is bonded to the first surface 118 of the glass structure 116. The third silicon substrate 702 can be aligned with the glass structure 116 to align appropriate portions of the working structure with glass features (e.g., recesses/mesas) on the first surface 118 of the glass structure 116.

A protective layer 120 can be included on the backside (outer surface opposite the first surface 118) of the glass structure 116 to cover the embedded silicon features 104 such that the embedded features 104 are not exposed on the backside of the glass structure 116. The protective layer 120 can protect the embedded features 104 from being etched during etching of the bulk 710 of the third silicon substrate 702 as described below.

Figure 9A:
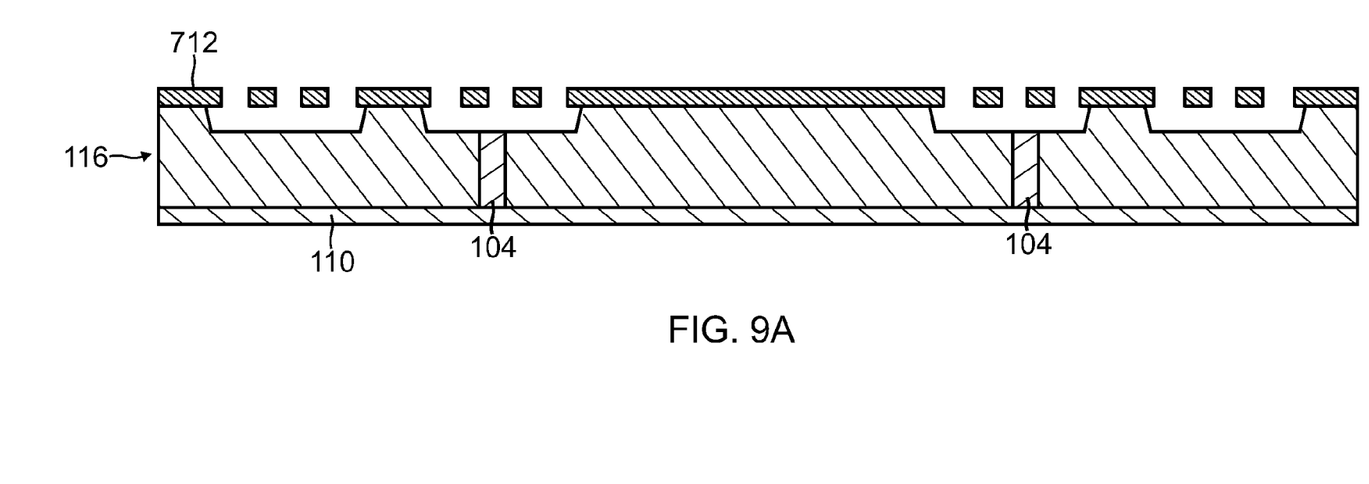
FIG. 9A is a cross-sectional view of the structure of FIG. 8 after the bulk of the silicon substrate of FIG. 7 is removed according to embodiments described herein.

As shown in FIG. 9A, the bulk 710 of the third silicon substrate 702 can then be removed. The bulk 710 can be removed by etching, such as by immersing the glass structure 116 with the third silicon substrate 702 bonded thereto in a liquid etchant. The liquid etchant can be a selective etchant that etches low doped or un-doped silicon while only slowly etching or not etching at all highly (degenerately) doped p-type silicon. EDP is an example of such an etchant. Accordingly, the selective etchant will etch away the bulk 710 of the third silicon substrate 702, but leave the working structure 712 formed by the highly doped layer of the third silicon substrate 702 intact and bonded to the glass structure 116. The glass structure 116 with the third silicon substrate 702 bonded thereto can be immersed in the liquid etchant to perform such etching. In some examples, the timing of the etching is controlled such that no or only minor etching of the silicon features 104 occurs from the first surface 116 once the bulk 710 of the third silicon substrate 702 is etched away. In an example, most of the bulk 710 is removed using a non-selective etchant such as potassium hydroxide (KOH) or grinding. Then, with less of the bulk 710 to remove, a selective etchant can be used to remove the remaining bulk 710.

Since the embedded features 104 are composed of low doped or un-doped silicon similar to the bulk 710 of the third silicon substrate 702, the embedded features 104 would also be etched by the etchant. The protective layer 120, however, protects the embedded features 104 by preventing contact of the etchant with the embedded features 104 from the backside of the glass structure 116. In an example, the protective layer 120 is another substrate (e.g., a cap wafer) that is bonded to the backside of the glass structure 116. In another example, the protective layer 120 is a coating such as a photoresist or polyimide. In yet another example, the protective layer 120 is a layer of glass left covering the embedded features 104 during formation of the glass substrate 116 as described above with respect to FIG. 4A. In an alternative example, a protective layer 120 is not used and the embedded silicon features 104 are etched away at the same time as the bulk of the third silicon substrate 702.

Figure 9B:
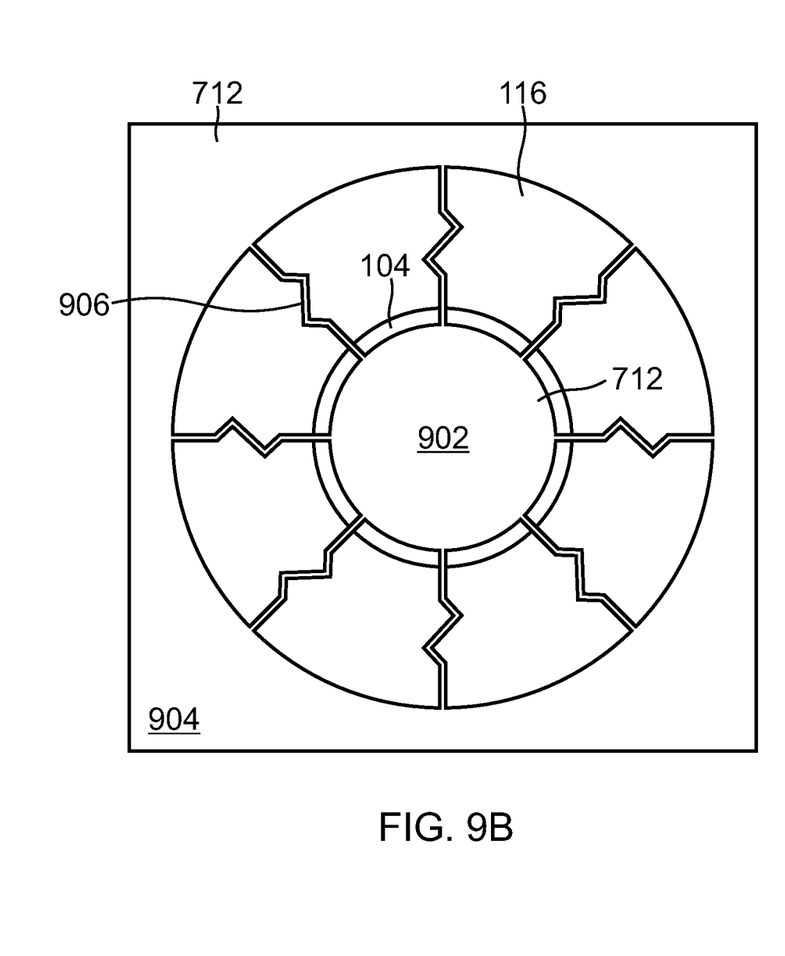
FIG. 9B is a top view of the structure of FIG. 9A according to embodiments described herein.

FIG. 9B is a top view of the third silicon substrate 702 of FIG. 9A showing the working structure 712 on the surface 118 of the planar glass substrate 116. In the example shown in FIG. 9B, the working structure 712 comprises a rotor 902 attached to an outer portion 904 via a plurality of springs 906. The sacrificial embedded feature 104 forms a boundary between distinct sections of the glass structure 116 wherein the section of the glass structure 116 to which the rotor 902 is attached is distinct from the section to which the outer portion 904 is attached. Thus, after removal of the sacrificial embedded feature 104, the rotor 902 and the section of the glass structure 116 to which the rotor 902 is attached can partially rotate relative to the outer portion 904 by flexing the springs 906. In other examples, other working structures can be formed.

Figure 10:
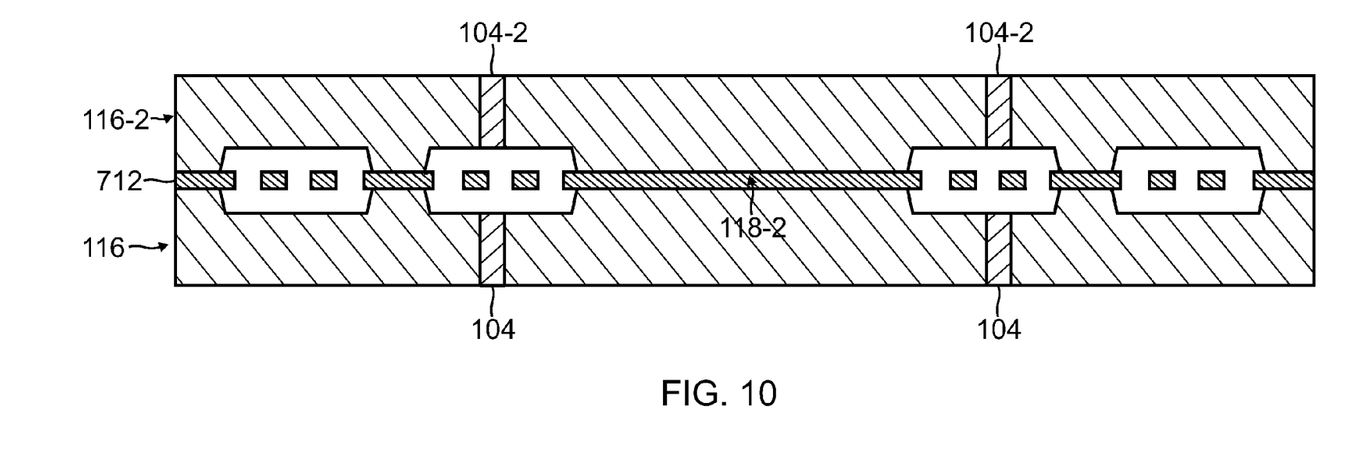
FIG. 10 is a cross-sectional view of the structure of FIG. 9 having another planar glass structure from FIG. 6 bonded thereto according to embodiments described herein.

After the etching is completed (e.g., the glass structure 116 and working structure 712 are removed from the liquid etchant), the protective layer 120 can be removed in an appropriate manner. As shown in FIG. 10, a second planar glass structure 116-2, formed in the same manner as the first glass structure 116 as described above, having embedded features 104-2 therein is bonded to an exposed surface of the working structure 712. The second planar glass structure 116-2 is oriented such that the (first) surface 118-2 having the glass features (e.g., recesses/mesas) defined therein is facing the first surface 118 of the first glass structure 116 and the surface 118-2 is bonded (e.g., an anodic bond) to the working structure 712 and/or the first surface 118 as appropriate. In the example shown in FIG. 10, the surface 118-2 is bonded to the working structure 712. The working structure 712, therefore, is bonded between the first glass structure 116 and the second glass structure 116-2.

The embedded features 104, 104-2 of the first and second planar glass structures 116, 116-2 are then etched away. In an example, etching away the embedded features 104 disconnects distinct sections of the first glass structure 116 from one another and etching away the embedded features 104-2 of the second planar glass structure 116-2 disconnects distinct sections of the second glass structure 116-2 from one another. The embedded features 104, 104-2 can be etched using a selective etchant, such as EDP, that etches the low doped or un-doped embedded features 104, 104-2 selectively over the degenerately doped p-type silicon layer forming the working structure 712.

Figure 11A:
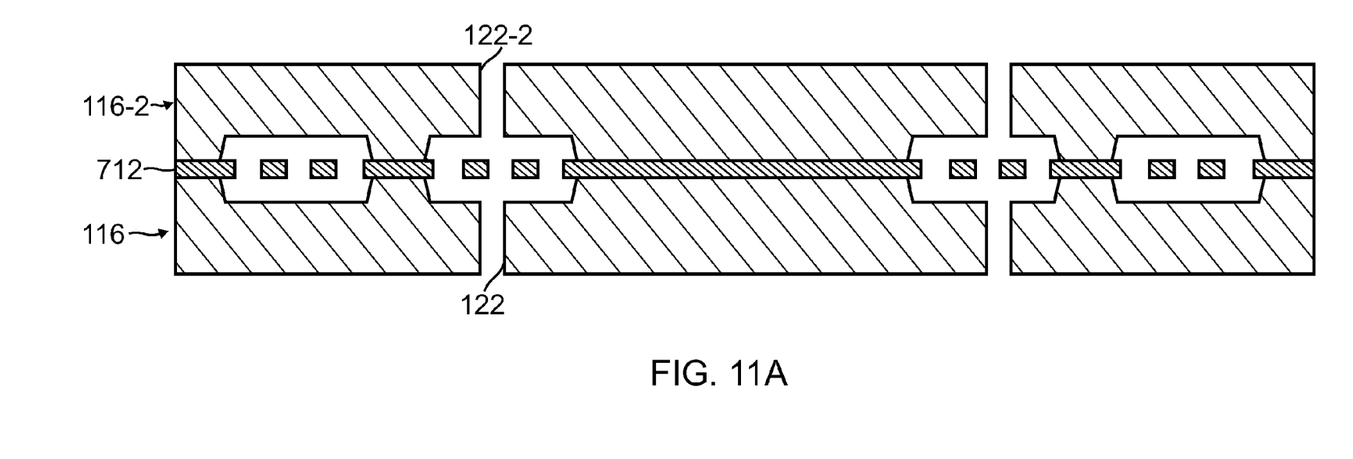
FIG. 11A is a cross-sectional view of the structure of FIG. 10 after etching to remove the silicon features in the planar glass structures according to embodiments described herein.
Figure 11B:
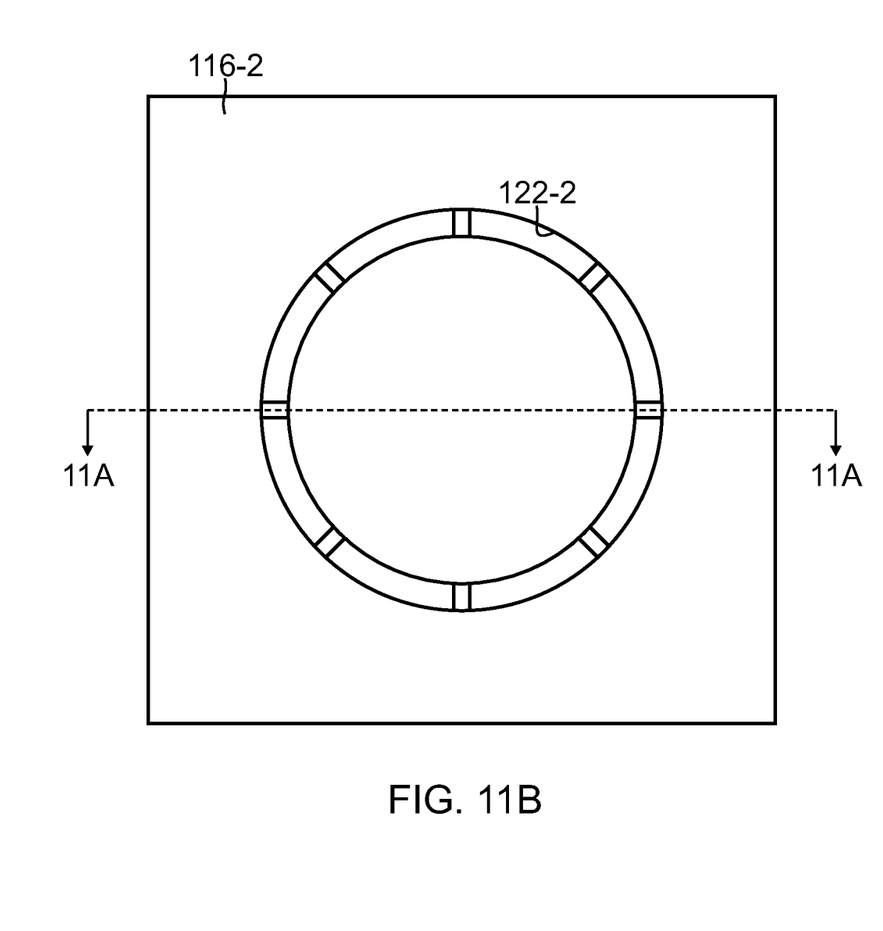
FIG. 11B is a top view of the structure of FIG. 11A according to embodiments described herein.

FIG. 11A illustrates an example of a completed MEMS structure after the embedded features 104, 104-2 of both the first glass structure 116 and the second glass structure 116-2 are etched away. FIG. 11B is top view of the completed MEMS structure. As shown, the completed MEMS structure includes a first (bottom) glass structure 116 comprising two distinct sections and a second (top) glass structure 116-2 comprising two distinct sections. The sections of the glass structures 116, 116-2 are separate from one another by a high aspect ratio ring shaped gap 122, 122-2. The high aspect ratio ring shaped gaps 122, 122-2 extend completely through each glass structure 116, 116-2 and is the negative of the silicon features 104, 104-2. That is, the high aspect ratio ring shaped gaps 122, 122-2 are the space that is left after etching out the embedded silicon features 104, 104-2. The resulting MEMS structure is a MEMS rotary suspension structure suspending the inner portion of the MEMS structure from the outer portion and the working structure also forms comb drives. The etching away the embedded features 104, 104-2 disconnects the sections of the first and second planar glass structures 116, 116-2 that are connected to the rotor 902 from the sections of the first and second planar glass structures 116, 116-2 that are connected to the outer portion 904. After etching away the embedded features 104, 104-2, the springs 906 are the only mechanical couple between the rotor portion (902) to the outer portion (904), thus enabling the rotor portion (902) to move relative to the outer portion 904.

Although a particular structure (i.e., a rotary platform) has been described, modifications to the above process can be made to fabricate other structures. Moreover, although particular geometries of gap 122 and features 104 as well as their depth through the glass structure are shown (e.g., the gap 122 and features 104 extend all the way through the glass structure 116), in other examples other geometries and/or depths for the features 104 and/or gap 122 can be used. In some examples, the embedded features 104 in the glass structure 116 can be formed of other sacrificial materials, such as metal. In such embodiments, the metal (or other sacrificial material) can be deposited on the silicon substrate 102 in the appropriate pattern to form the to-be embedded features 104 which will be embedded in the glass substrate 110. The glass substrate 110 can then be bonded to the top working surface 106 and heated to vacuum form to the embedded features 104 as describe above with respect to FIG. 3.

Similar processes can be used to form other structures such as inertial sensors and quartz/glass resonators.

EXAMPLE EMBODIMENTS

Example 1 includes a method of fabricating a MEMS structure, the method comprising: fabricating a working structure in a doped layer proximate a first surface of a silicon substrate; bonding the first surface of the silicon substrate to a first planar glass structure having a first one or more sacrificial features embedded therein; etching to remove a bulk of the silicon substrate, wherein the bulk is reverse of the first surface on the silicon substrate, wherein etching removes the bulk and leaves the working structure bonded to the first planar glass structure; and etching to remove the first one or more sacrificial features from the first planar glass structure.

Example 2 includes the method of Example 1, wherein etching to remove the first one or more sacrificial features separates the first planar glass structure into multiple distinct sections that are mechanically coupled together via the working structure.

Example 3 includes the method of any of Examples 1 or 2, wherein the doped layer of the silicon substrate is degenerately p-type doped and wherein etching to remove the bulk of the silicon substrate is performed, at least in part, using a selective etchant that etches lower doped silicon selectively over higher doped silicon.

Example 4 includes the method of Example 3, wherein etching to remove the first one or more sacrificial features is performed using a selective etchant that etches lower doped silicon selectively over higher doped silicon.

Example 5 includes the method of any of Examples 1-4, comprising: bonding an exposed surface of the working structure to a second planar glass structure having a second one or more sacrificial features embedded therein, when the working structure is bonded to the first planar glass structure, thereby disposing the working structure between the first planar glass structure and the second planar glass structure; and etching to remove the second one or more sacrificial features from the second planar glass structure.

Example 6 includes the method of Example 5, comprising: etching a first one or more glass features in the top surface of the first planar glass structure; wherein bonding the first surface of the silicon substrate to the first planar glass substrate includes bonding the first surface of the silicon substrate to the top surface of the first planar glass structure; etching a second one or more glass features in the top surface of the second planar glass structure; wherein bonding an exposed surface of the working structure to the second planar glass substrate includes bonding the working structure to the top surface of the second planar glass structure.

Example 7 includes the method of Example 6, comprising: partially etching the first one or more sacrificial features in the first planar glass structure proximate a top surface of the first planar glass structure prior to bonding the silicon substrate to the first planar glass structure; and partially etching the second one or more sacrificial features in the second planar glass structure proximate a top surface of the second planar glass structure prior to bonding an exposed surface of the working structure to the second planar glass structure.

Example 8 includes the method of any of Examples 1-7, wherein prior to etching to remove the bulk of the silicon substrate, placing a protective layer over a bottom surface of the first planar glass substrate, wherein the bottom surface is opposite a surface having the silicon substrate bonded thereto.

Example 9 includes the method of Example 8, wherein placing a protective layer over the bottom surface includes one of placing a cap wafer on the bottom surface, placing a coating on the bottom surface, or leaving a layer of glass over the first one or more sacrificial features.

Example 10 includes the method of any of Examples 1-9, comprising: doping the first surface of the silicon substrate to form the doped layer as a degenerately doped p-type layer.

Example 11 includes the method of any of Examples 1-10, comprising: forming the first planar glass structure having one or more sacrificial features embedded therein by: fabricating one or more features on a second surface of a second silicon substrate; bonding a glass substrate to the second surface of the second silicon substrate such that one or more sealed vacuums are formed between the glass substrate and the second silicon substrate; heating the glass substrate to cause the glass substrate to flow into the one or more sealed vacuums; removing a portion of an outer surface of the glass substrate and a bulk of the second silicon substrate to form a planar glass structure having the one or more features embedded therein, wherein the one or more features are the one or more sacrificial features.

Example 12 includes the method of Example 11, wherein fabricating one or more features on the second surface includes forming features having different heights.

Example 13 includes the method of any of Examples 11 or 12, wherein removing a portion of an outer surface of the glass substrate and a bulk of the second silicon substrate comprises exposing at least some of the one or more features on both a top and bottom surfaces of the planar glass structure.

Example 14 includes the method of any of Examples 11-13, comprising: fabricating an edge feature around a perimeter of the second silicon substrate.

Example 15 includes the method of any of Examples 11-14, wherein fabricating one or more features on a second surface of a second silicon substrate comprises etching the second surface to form the one or more features out of silicon.

Example 16 includes the method of any of Examples 11-15, wherein fabricating one or more features on a second surface of a second silicon substrate comprises depositing a metal on the second surface to form the one or more features out of metal.

Example 17 includes a method of fabricating a MEMS structure, the method comprising: providing a first planar glass structure having one or more sacrificial features embedded therein and a second planar glass structure having one or more sacrificial features embedded therein; fabricating a working structure in a doped layer proximate a top working surface of a silicon substrate; bonding the silicon substrate to the first planar glass structure such that the top working surface is bonded to the first planar glass structure; etching to remove a bulk of the silicon substrate; bonding the second planar glass structure to an exposed surface of the working structure bonded to the first planar glass structure; and etching to remove the one or more features from the first planar glass structure and the one or more features from the second planar glass structure.

Example 18 includes the method of Example 17, wherein the working structure comprises a rotor, an outer portion, and a plurality of springs connecting the rotor to the outer portion, wherein etching to remove the one or more features from the first planar glass structure and the one or more features from the second planar glass structure includes disconnecting sections of the first and second planar glass structures that are attached to the rotor from sections of the first and second planar glass structures that are attached to the outer portion.

Example 19 includes a method of fabricating a MEMS structure, the method comprising: providing a first glass wafer defining a plurality of regions, each region corresponding to a distinct MEMS structure, each region having one or more sacrificial features embedded therein; providing a second glass wafer defining a plurality of regions, each region corresponding to a distinct MEMS structure, each region having one or more sacrificial features embedded therein; fabricating a working structure in a degenerately doped p-type layer proximate a top working surface of a silicon wafer; bonding the silicon wafer to the first glass wafer such that the top working surface is bonded to the first glass wafer; selectively etching to remove a bulk of the silicon wafer, such that the working structure remains; bonding the second glass wafer to an exposed surface of the working structure bonded to the first glass wafer; selectively etching to remove the one or more features from the first glass wafer and the one or more features from the second glass wafer; and singulating the second glass wafer bonded to the working structure bonded to the first glass wafer about the plurality of regions to form a plurality of MEMS structures.

Example 20 includes the method of Example 19, wherein the working structure comprises a rotor, an outer portion, and a plurality of springs connecting the rotor to the outer portion, wherein etching to remove the one or more features from the first glass wafer and the one or more features from the second glass wafer includes disconnecting sections of the first and second glass wafers that are attached to the rotor from sections of the first and second glass wafers that are attached to the outer portion.

What is claimed is:

1. A method of fabricating a MEMS structure, the method comprising:
    fabricating a working structure in a doped layer proximate a first surface of a silicon substrate;
    bonding the first surface of the silicon substrate to a first planar glass structure having a first one or more sacrificial features embedded therein;
    etching to remove a bulk of the silicon substrate, wherein the bulk is reverse of the first surface on the silicon substrate, wherein etching removes the bulk and leaves the working structure bonded to the first planar glass structure; and
    etching to remove the first one or more sacrificial features from the first planar glass structure.

2. The method of claim 1, wherein etching to remove the first one or more sacrificial features separates the first planar glass structure into multiple distinct sections that are mechanically coupled together via the working structure.

3. The method of claim 1, wherein the doped layer of the silicon substrate is degenerately p-type doped and wherein etching to remove the bulk of the silicon substrate is performed, at least in part, using a selective etchant that etches lower doped silicon selectively over higher doped silicon.

4. The method of claim 3, wherein etching to remove the first one or more sacrificial features is performed using a selective etchant that etches lower doped silicon selectively over higher doped silicon.

5. The method of claim 1, comprising:
    bonding an exposed surface of the working structure to a second planar glass structure having a second one or more sacrificial features embedded therein, when the working structure is bonded to the first planar glass structure, thereby disposing the working structure between the first planar glass structure and the second planar glass structure; and
    etching to remove the second one or more sacrificial features from the second planar glass structure.

6. The method of claim 5, comprising:
    etching a first one or more glass features in the top surface of the first planar glass structure;
    wherein bonding the first surface of the silicon substrate to the first planar glass substrate includes bonding the first surface of the silicon substrate to the top surface of the first planar glass structure;
    etching a second one or more glass features in the top surface of the second planar glass structure;
    wherein bonding an exposed surface of the working structure to the second planar glass substrate includes bonding the working structure to the top surface of the second planar glass structure.

7. The method of claim 6, comprising:
    partially etching the first one or more sacrificial features in the first planar glass structure proximate a top surface of the first planar glass structure prior to bonding the silicon substrate to the first planar glass structure; and
    partially etching the second one or more sacrificial features in the second planar glass structure proximate a top surface of the second planar glass structure prior to bonding an exposed surface of the working structure to the second planar glass structure.

8. The method of claim 1, wherein prior to etching to remove the bulk of the silicon substrate, placing a protective layer over a bottom surface of the first planar glass substrate, wherein the bottom surface is opposite a surface having the silicon substrate bonded thereto.

9. The method of claim 8, wherein placing a protective layer over the bottom surface includes one of placing a cap wafer on the bottom surface, placing a coating on the bottom surface, or leaving a layer of glass over the first one or more sacrificial features.

10. The method of claim 1, comprising:
    doping the first surface of the silicon substrate to form the doped layer as a degenerately doped p-type layer.

11. The method of claim 1, comprising:
    forming the first planar glass structure having one or more sacrificial features embedded therein by:
        fabricating one or more features on a second surface of a second silicon substrate;
        bonding a glass substrate to the second surface of the second silicon substrate such that one or more sealed vacuums are formed between the glass substrate and the second silicon substrate;
        heating the glass substrate to cause the glass substrate to flow into the one or more sealed vacuums;
        removing a portion of an outer surface of the glass substrate and a bulk of the second silicon substrate to form a planar glass structure having the one or more features embedded therein, wherein the one or more features are the one or more sacrificial features.

12. The method of claim 11, wherein fabricating one or more features on the second surface includes forming features having different heights.

13. The method of claim 11, wherein removing a portion of an outer surface of the glass substrate and a bulk of the second silicon substrate comprises exposing at least some of the one or more features on both a top and bottom surfaces of the planar glass structure.

14. The method of claim 11, comprising:
fabricating an edge feature around a perimeter of the second silicon substrate.

15. The method of claim 11, wherein fabricating one or more features on a second surface of a second silicon substrate comprises etching the second surface to form the one or more features out of silicon.

16. The method of claim 11, wherein fabricating one or more features on a second surface of a second silicon substrate comprises depositing a metal on the second surface to form the one or more features out of metal.

17. A method of fabricating a MEMS structure, the method comprising:
providing a first planar glass structure having one or more sacrificial features embedded therein and a second planar glass structure having one or more sacrificial features embedded therein;
fabricating a working structure in a doped layer proximate a top working surface of a silicon substrate;
bonding the silicon substrate to the first planar glass structure such that the top working surface is bonded to the first planar glass structure;
etching to remove a bulk of the silicon substrate;
bonding the second planar glass structure to an exposed surface of the working structure bonded to the first planar glass structure; and
etching to remove the one or more features from the first planar glass structure and the one or more features from the second planar glass structure.

18. The method of claim 17, wherein the working structure comprises a rotor, an outer portion, and a plurality of springs connecting the rotor to the outer portion, wherein etching to remove the one or more features from the first planar glass structure and the one or more features from the second planar glass structure includes disconnecting sections of the first and second planar glass structures that are attached to the rotor from sections of the first and second planar glass structures that are attached to the outer portion.

19. A method of fabricating a MEMS structure, the method comprising:
providing a first glass wafer defining a plurality of regions, each region corresponding to a distinct MEMS structure, each region having one or more sacrificial features embedded therein;
providing a second glass wafer defining a plurality of regions, each region corresponding to a distinct MEMS structure, each region having one or more sacrificial features embedded therein;
fabricating a working structure in a degenerately doped p-type layer proximate a top working surface of a silicon wafer;
bonding the silicon wafer to the first glass wafer such that the top working surface is bonded to the first glass wafer;
selectively etching to remove a bulk of the silicon wafer, such that the working structure remains;
bonding the second glass wafer to an exposed surface of the working structure bonded to the first glass wafer;
selectively etching to remove the one or more features from the first glass wafer and the one or more features from the second glass wafer; and
singulating the second glass wafer bonded to the working structure bonded to the first glass wafer about the plurality of regions to form a plurality of MEMS structures.

20. The method of claim 19, wherein the working structure comprises a rotor, an outer portion, and a plurality of springs connecting the rotor to the outer portion, wherein etching to remove the one or more features from the first glass wafer and the one or more features from the second glass wafer includes disconnecting sections of the first and second glass wafers that are attached to the rotor from sections of the first and second glass wafers that are attached to the outer portion.

* * * * *